(12) United States Patent
Danley

(10) Patent No.: US 6,821,130 B2
(45) Date of Patent: Nov. 23, 2004

(54) DEVICE AND METHOD USING A FLEXIBLE CIRCUIT SECURED FOR RELIABLY INTER-CONNECTING COMPONENTS THEREIN IN THE PRESENCE OF VIBRATION EVENTS

(75) Inventor: Brooks H Danley, El Paso, TX (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/222,160

(22) Filed: Aug. 16, 2002

(65) Prior Publication Data

US 2004/0033706 A1 Feb. 19, 2004

(51) Int. Cl.[7] .............................................. H01R 12/00
(52) U.S. Cl. ...................... 439/67; 439/329; 439/501
(58) Field of Search .............................. 439/67, 15, 75, 439/164, 501, 329, 492–493, 362–364, 422, 562; 336/192, 198, 208

(56) References Cited

U.S. PATENT DOCUMENTS

| | | | |
|---|---|---|---|
| 2,524,939 A | * 10/1950 | Evers et al. .................. 439/58 |
| 4,526,432 A | * 7/1985 | Cronin et al. ................ 439/320 |
| 5,205,754 A | * 4/1993 | Kuramoto .................... 439/164 |
| 5,591,041 A | * 1/1997 | Cecil et al. .................. 439/352 |
| 6,032,359 A | * 3/2000 | Carroll ......................... 29/881 |
| 6,302,385 B1 | 10/2001 | Summers, III et al. |
| 6,454,303 B2 | 9/2002 | Ashtiani et al. |
| 6,497,432 B2 | 12/2002 | Scheib et al. |
| 6,517,114 B1 | 2/2003 | Scheib et al. |
| 2003/0017735 A1 | * 1/2003 | Singh ........................... 439/329 |

* cited by examiner

*Primary Examiner*—Truc T. Nguyen
*Assistant Examiner*—James R. Harvey
(74) *Attorney, Agent, or Firm*—Jimmy L. Funke

(57) ABSTRACT

Device and method including a generally flat and flexible circuit for electrically inter-connecting components therein are provided. The device includes a post including a recessed section configured to receive the flexible circuit through an opening in said circuit. The structures defining the opening in the flexible circuit may be configured to provide a snap-fit between the circuit and the recessed section of the post, and thus avoid undesirable movement of the flex circuit in the presence of vibration.

7 Claims, 2 Drawing Sheets

DEVICE AND METHOD USING A FLEXIBLE CIRCUIT SECURED FOR RELIABLY INTERCONNECTING COMPONENTS THEREIN IN THE PRESENCE OF VIBRATION EVENTS

BACKGROUND OF THE INVENTION

The present invention is generally related to electrical or electromechanical devices, and, more particularly, to apparatus and techniques for securely affixing and routing in such devices, notwithstanding the presence of vibration, conductor circuit elements, such as may be made up of generally thin, flat, and flexible elements, commonly referred to as a "flex circuit".

Electrical or electromechanical devices, e.g., modular devices, used in equipment subject to vibration, such as may be used in automotive, aerospace, and other industrial applications need to be carefully designed to be substantially unaffected when exposed to any such vibration. For example, these devices may use flexible conductors to make electrical connections between one or more components associated with the device, such as electronic, sensor and actuator components. During vibration conditions, the flexible circuit has a tendency to randomly move around, and rub on the components internal to the module. This rubbing action could eventually cause wear and tear of the flexible circuit, which can result in undesirable electrical shorts.

Unfortunately, prior to the present invention, some possible techniques for somewhat alleviating the vulnerability of the flexible circuit to vibration-induced rubbing and eventual wear-out tend to introduce new problems. For example, one could glue the flexible circuit to a can or housing that encloses the device in order to prevent movement of the flexible circuit. Another possible solution would be to add an additional protective layer of plastic to the flexible circuit. This second layer would serve as a barrier, which would have to be worn through before the flexible circuit would become exposed. However, neither of these solutions is fully satisfactory. The use of glue is generally a messy and time-consuming process; and providing the additional protective layer is not a fool-proof solution, since the protective layer still would be subject to the rubbing action and that layer could eventually be worn through.

Thus, it is desirable to provide affixing technique and structure that, at a low-cost, reliably avoids the foregoing issues. It would be further desirable to provide affixing technique and structure that would result in a more reliable and durable electrical connection in the modular device, notwithstanding of exposure to vibration.

BRIEF SUMMARY OF THE INVENTION

Generally, the present invention fulfills the foregoing needs by providing in one aspect thereof a device including a generally flat and flexible circuit for electrically interconnecting components therein. The device includes a post including a recessed section configured to receive the flexible circuit through an opening in said circuit. The structures defining the opening in the flexible circuit may be configured to provide a snap-fit between the circuit and the recessed section of the post, and thus avoid undesirable movement of the flex circuit in the presence of vibration.

The present invention further fulfils the foregoing needs by providing in another aspect thereof a method for interconnecting components in a device using a generally flat and flexible circuit. The method allows providing a post including a recessed section configured to receive the flexible circuit through an opening in the circuit. The method further allows configuring the structures defining the opening in the flexible circuit to provide a snap-fit between the circuit and the recessed section of the post, and thus avoid undesirable movement of the flex circuit in the presence of vibration.

In yet another aspect thereof, the present invention provides a method for assembling a generally flat and flexible circuit providing interconnections in a device. The method allows providing a post including recessed and non-recessed sections. The recessed section is configured to receive the flexible circuit through an opening in a first segment of the circuit. The method further allows inserting the non-recessed portion of the post through the opening in the flexible circuit. Insertion is continued until the first segment of the flexible circuit is received by the recessed section to provide a snap-fit therebetween.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
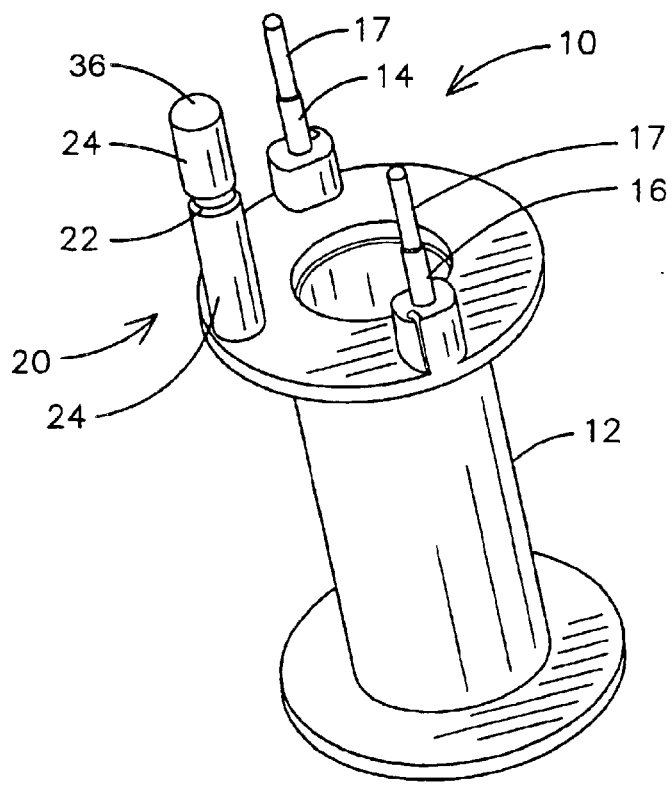
FIG. 1 illustrates an isometric view of an exemplary device embodying aspects of the invention, such as a post that may be used to separate a flex circuit from any components and structures inside of the device.
Figure 2:
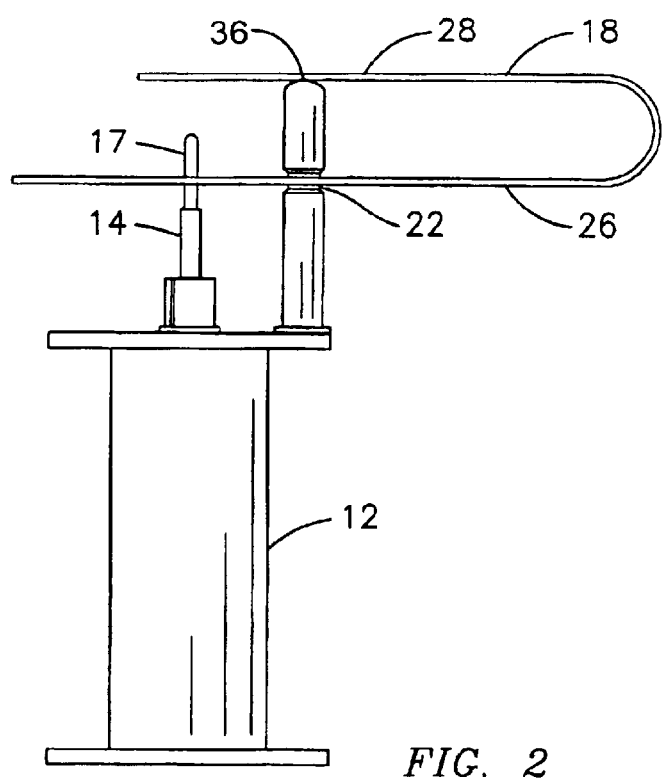
FIG. 2 is a plan view of the device of FIG. 1.

FIG. 1 illustrates an isometric view of an exemplary device 10 embodying aspects of the invention. In one exemplary embodiment, device 10 comprises a spool 12 that may be used for carrying a winding, and other associated components (not shown). Spool 12 may be constructed of plastic or any suitable polymer that may be molded into any desired configuration using molding techniques well understood by those skilled in the art, such as injection molding. Device 10 may be part of a piece of equipment that may be used in automotive, aerospace, and other industrial applications to provide electrical signals useful to achieve any desired equipment functionality. In one exemplary embodiment, spool 12 may include terminals 17 that in turn may include affixing pads 14 and 16, e.g., soldering pads or equivalent, connectable to a generally thin, flat, and flexible (flex) circuit 18, (FIG. 2).

The inventor of the present invention has innovatively recognized that a post 20 may be used to separate flex circuit 18 from any components and structures inside of the device, which otherwise could harm the flex circuit during a vibration condition. In one exemplary embodiment, post 20 is formed as an integral structure of spool 12 and comprises a generally cylindrical post. It will be understood, however, that the present invention does not require the post to be cylindrical, since other configurations may be used for the post, such as polygonal, triangular, square, oval, etc. As shown in FIG. 1, post 20 includes a recessed section 22 with a smaller diameter relative to non-recessed sections 24. In one exemplary embodiment, recess 22 is disposed generally intermediate relative to the opposite ends of the post to allow a first segment 26 of the flex circuit to be securely held in place. In one embodiment, the positioning of recess 22 along post 20 relative to the soldering or affixing pads on terminals 14 and 16 may be chosen to share a common alignment between one another, such as sharing a common horizontal plane, to facilitate the soldering or affixing operation for connecting the flex circuit to terminals 17. As further shown in FIG. 2, in one exemplary embodiment, the flex circuit may be foldable over itself to form a second segment 28. This second segment may be supportable by the top end 36 of post 20, where it would be isolated from any other components inside the enclosure.

Figure 3:
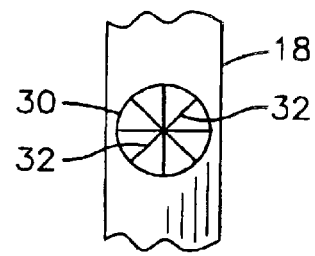
FIGS. 3 and 4 respectively illustrate exemplary embodiments of an opening situated in the flex circuit and configured to slidably allow inserting the flex circuit through post to reach a recess on the post.
Figure 4:
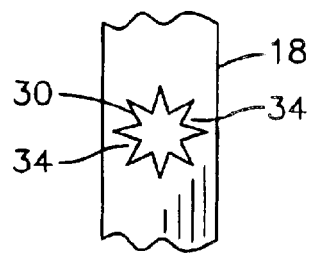

FIGS. 3 and 4 respectively illustrate respective embodiments of an opening 30 situated in the flex circuit and configured to slidably allow inserting post 20 through the flex circuit. As used herein the term opening encompasses any opening that may result within opposing resilient structures, such as may be formed in a flexible material like the material of which the flex circuit is made up, either in the form of closely juxtaposed slits 32, or in the form of spaced-apart gripping facets 34. Once the flex circuit is pushed along the post to reach the recess section, the slits or gripping facets, due to their springiness characteristics would expand into the recess and allow for providing a snap-fit between the first segment of the flex circuit and the post. The opening in FIG. 3 comprises closely juxtaposed slits, and may be analogized to the opening in a lid of a drinking cup that allows passage to a straw into the cup. Conversely, the opening in FIG. 4 comprises spaced-apart gripping facets in an exemplary star-shaped opening. It will be appreciated by those skilled in the art that the present invention is not limited to any specific configuration for the opening in the flex circuit so long as that configuration is able to allow sliding the flex circuit over the non-recessed sections of the post, and then allow providing a snap-fit when the flex circuit is at the recess. In operation, the opposing structures or gripping facets that define the opening in the flex circuit cooperate with the recessed section of the post to provide a secure mechanical connection that allows reducing or eliminating the possibility of the flex circuit rubbing with any internal components of the device in the event of vibration conditions. As will be appreciated by those skilled in the art, snap-fit generally refers to any mechanical means of fastening two or more objects together by which structural features of one object interlock with corresponding features of another object thus achieving a secure connection between the two objects.

Figure 5:
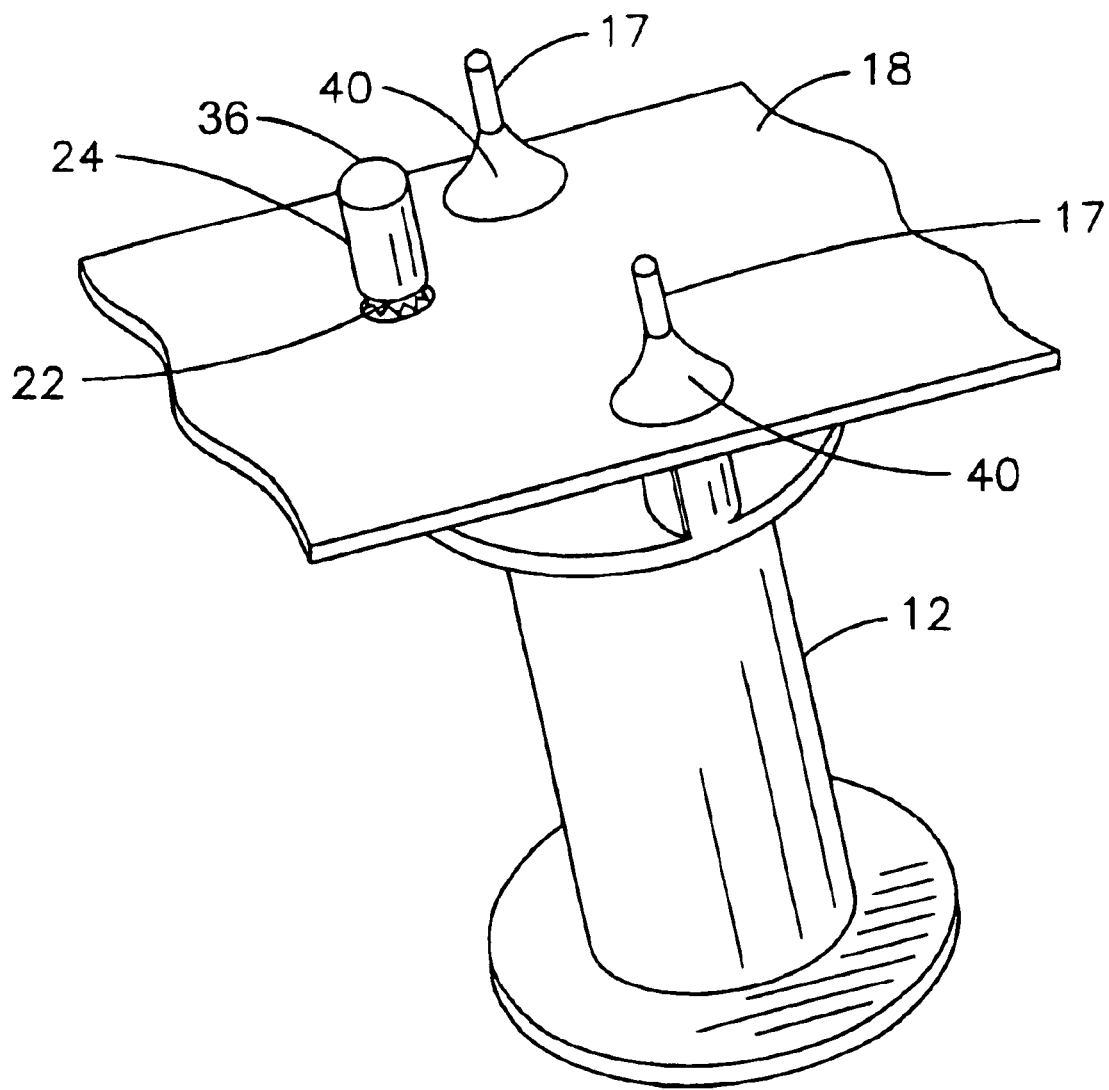
FIG. 5 is an isometric view illustrating exemplary connections, e.g., soldering connections, between the flex circuit and respective terminals of the device of FIG. 1.

FIG. 5 is an isometric view illustrating exemplary connections, e.g., soldering connections 40, between the flex circuit 18 and respective terminals 17 of the device. In one exemplary embodiment, the connection may be made through affixing pads 14 and 16 (FIG. 1) that may be part of the terminals. It will be appreciated that soldering is just one example of one technique for connecting the terminals to the flex circuit. Those skilled in the art will readily recognize many other standard affixing techniques that could be used in lieu of soldering, such as solderless affixing techniques.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A device including a generally flat and flexible circuit for electrically inter-connecting components therein, the device comprising:
   a spool;
   a post that is integral with said spool, including a recessed section configured to receive the flexible circuit through an opening in said circuit, the structures defining the opening in the flexible circuit being configured to provide a snap-fit between the circuit and the recessed section of the post, and thus avoid undesirable movement of the flex circuit in the presence of vibration.

2. The device of claim 1 further comprising one or more terminals extending from the spool, each terminal including an affixing pad, and wherein the recess is positioned relative to the affixing pads to share a common alignment therebetween.

3. The device of claim 1 wherein the structures defining the opening are arranged to form a plurality of closely juxtaposed slits.

4. The device of claim 1 wherein the structures defining the opening comprise a plurality of gripping facets.

5. A method for assembling a generally flat and flexible circuit providing interconnections in a device, the method comprising:
   providing a spool having an integral post, said post including recessed and non-recessed sections, the recessed section configured to receive the flexible circuit through an opening in a first segment of said circuit;
   inserting the non-recessed portion of the post through the opening in the flexible circuit;
   continuing insertion until the first segment of the flexible circuit is received by the recessed section to provide a snap-fit therebetween.

6. The method of claim 5 further comprising looping the flex circuit so that a second segment of the flexible circuit is supported by one end of the post.

7. The method of claim 6 further comprising connecting respective conductors in said flexible circuit to respective terminals of the device to provide electrical coupling therebetween.

* * * * *